United States Patent
Cao et al.

(10) Patent No.: US 7,371,312 B2
(45) Date of Patent: May 13, 2008

(54) USING CELL VOLTAGE AS A MONITOR FOR DEPOSITION COVERAGE

(75) Inventors: Yang Cao, Beaverton, OR (US); Yue Ma, Hillsboro, OR (US); Jir-shyr Chen, Beavergon, OR (US); Rajiv Rastogi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 10/816,495

(22) Filed: Mar. 31, 2004

(65) Prior Publication Data

US 2005/0227381 A1    Oct. 13, 2005

(51) Int. Cl.
 *C25D 21/12* (2006.01)
(52) U.S. Cl. ............................. 205/81; 205/82; 205/83
(58) Field of Classification Search .................. 205/81, 205/83, 82
 See application file for complete search history.

(56) References Cited

U.S. PATENT DOCUMENTS 6,156,167 A    12/2000  Patton et al.
6,258,220 B1   7/2001   Dordi et al.
6,436,249 B1   8/2002   Patton et al.
6,516,815 B1   2/2003   Stevens et al.
6,582,578 B1   6/2003   Dordi et al.
6,599,402 B2   7/2003   Dordi et al.

*Primary Examiner*—Susy Tsang-Foster
*Assistant Examiner*—William T. Leader
(74) *Attorney, Agent, or Firm*—Blakely, Sokoloff, Taylor & Zafman LLP

(57) ABSTRACT

A method and apparatus are described that use cell voltage and/or current as monitor to prevent electrochemical deposition (e.g., electroplating) tools from deplating wafers with no or poor metal (e.g., Cu) seed coverage. In one embodiment, the voltage of a plating cell including a reference wafer which has substantially complete Cu seed coverage is measured. A reference resistance of the plating cell with the reference wafer is determined. The voltage of the plating cell including a calibration wafer which has no or insufficient seed coverage at its edge is measured. A calibration resistance of the plating cell with the calibration wafer is determined. An error trigger based on a comparison of the reference resistance with the calibration resistance is selected.

11 Claims, 7 Drawing Sheets

| PLATING CURRENT 410 | CELL VOLTAGE REFERENCE WAFER 420 | CELL VOLTAGE CALIBRATION WAFER 430 | CELL VOLTAGE DIFFERENCE 440 | RATIO 450 |
|---|---|---|---|---|
| 0.1 | 0.06957 | 0.10626 | 0.03669 | 0.527382 |
| 0.2 | 0.13914 | 0.21252 | 0.07338 | 0.527382 |
| 0.5 | 0.34785 | 0.5313 | 0.18345 | 0.527382 |
| 1 | 0.6957 | 1.0626 | 0.3669 | 0.527382 |
| 2 | 1.3914 | 2.1252 | 0.7338 | 0.527382 |
| 5 | 3.4785 | 5.313 | 1.8345 | 0.527382 |
| 10 | 6.957 | 10.626 | 3.669 | 0.527382 |
| 15 | 10.4355 | 15.939 | 5.5035 | 0.527382 |

FIG. 4

USING CELL VOLTAGE AS A MONITOR FOR DEPOSITION COVERAGE

FIELD

Embodiments of this invention relate to the field of processing and, in particular, to tools used in electrochemical metal deposition.

BACKGROUND

Using copper (Cu) for ultra large scale integrated (ULSI) metal interconnects has become the standard industry trend in semiconductor chip manufacturing since IBM announced copper dual-damascene process technology in September 1997. Void free fill of Cu into small aggressive feature sizes (e.g., currently <100 nanometers) with relatively high aspect ratios covered with continuous barrier and seed layers may be achieved with electroplating. The electroplating operation basically involves electrochemically depositing Cu onto the surface of a wafer. The whole surface of the wafer is covered with a continuous, thin deposited Cu seed layer that serves as a cathode electrode in the electroplating cell of the electroplating system.

On problem with prior electroplating operations is the accidentally processing of wafer without Cu seed coverage or poor seed coverage at the electrical contacts with a wafer. This can lead to Cu metal deposition occurring very near the electrical contact points of a plating system. As the deposits accumulate on the electrical contact points, pieces of the electroplating metal debris may fall into plating bath that can eventually cause serious plating defects on wafers that are subsequently processed. The corrective action requires the removal of the entire plating bath solution and the cleaning of all related processing equipment. Such corrective action may require significant system down time (the amount of time that the system is not available for use) and, thereby, have an impact on the plating system operational time. Therefore, the degree of plating coverage may be monitored by plating systems to ensure proper system operation.

One prior plating system by Novellus Systems Inc. (NVLS) has a clamshell configuration that insulates the wafer edge from the plating bath using an o-ring seal to prevent the electrolyte solution from getting inside the clamshell and, thereby, the electrical contact points, as illustrated in FIG. 1A. The electrical contact to the wafer is made with metal contact points placed near the edges of the wafer. A circuit resistance is measured between the contact points near the edge of the wafer. A significant resistance difference will exist between a metal edge covered wafer and a non-metal edge covered wafer surface. Such resistance differences are used by the NVLS system to detect whether a wafer has seed layer coverage on the edge. One problem with the NVLS system is poor edge uniformity on a processed wafer.

Another prior plating system by Applied Materials (AMAT) uses a laser edge detector, illustrated in FIG. 1B. The laser edge detector can distinguish a Cu seed covered edge from a non-covered edge by detecting a difference between a laser beam reflected from a Cu film edge and a non-Cu covered (e.g., barrier layer) edge. The AMAT plating system uses a thrust plate and contact ring that are exposed to the electroplating bath. One problem with the AMAT system is that no meaningful internal circuit can be available to allow wafer edge surface conductivity measurement because the contact ring is made of single piece of metal. Another problem with the AMAT system is that laser edge bevel removal (EBR) detection is extremely expensive and it is not reliable for detecting patterned wafers or wafers with only partial seed coverage. Yet another disadvantage is that the laser detection method may only be able to detect a Cu seed metal from a tantalum (Ta) or Ta alloy barrier layer surface based on the reflectivity. Its capability of distinguishing other metals from non-metallic surfaces remains unknown.

BRIEF DESCRIPTION OF THE DRAWINGS

Embodiments of the present invention are illustrated by way of example and not intended to be limited by the figures of the accompanying drawings.

FIG. 4 is a table illustrating experimental cell voltage measurements for a reference wafer and a calibration wafer for various plating currents.

DETAILED DESCRIPTION

Figure 1A:
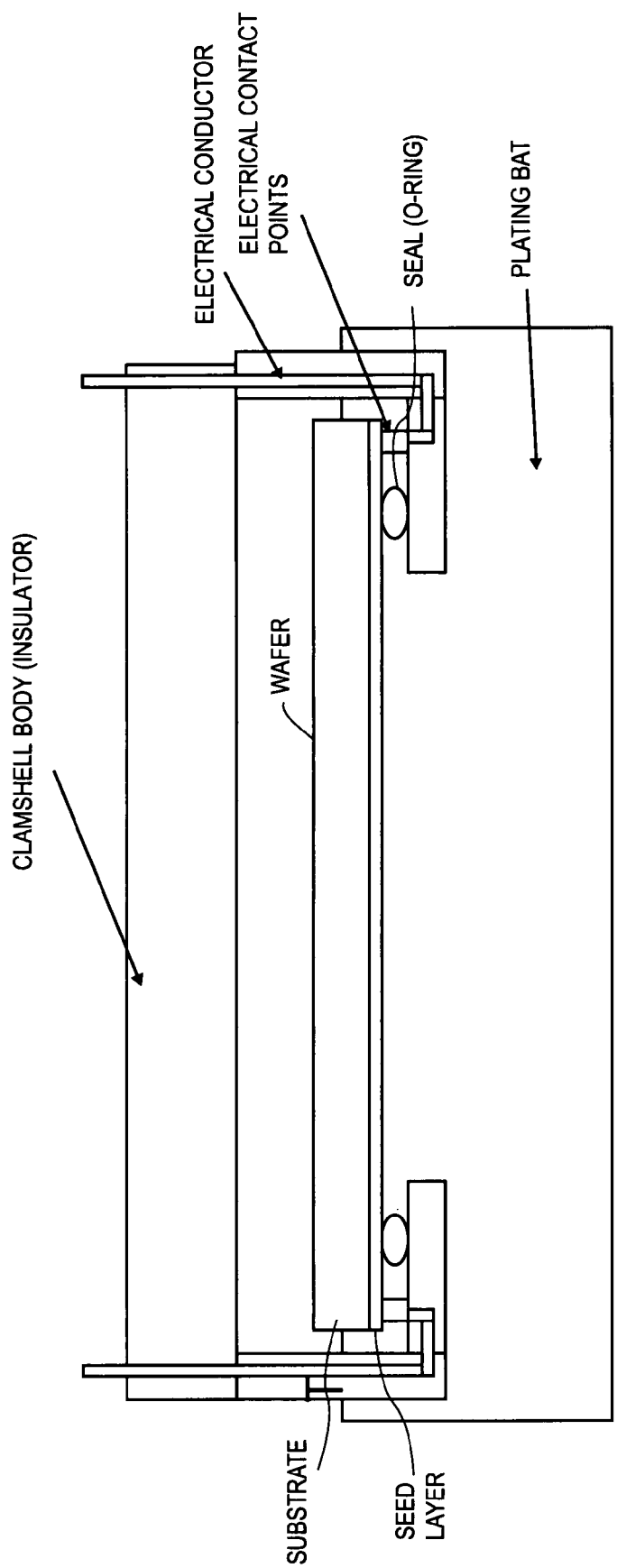
FIG. 1A illustrates a prior plating system.
Figure 1B:
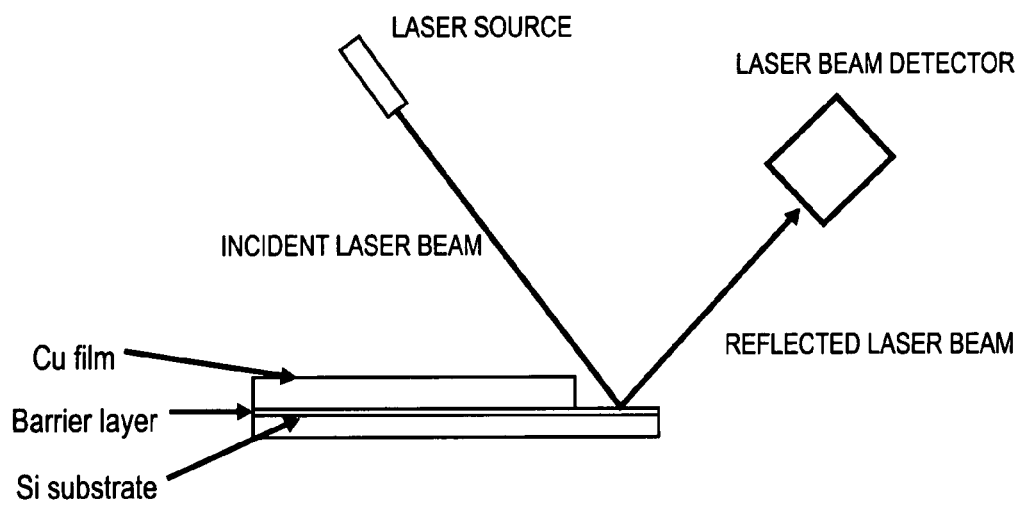
FIG. 1B illustrate a prior laser edge detection system.

In the following description, numerous specific details are set forth such as examples of specific systems, techniques, components, etc. in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

Embodiments of the present invention includes various steps, which will be described below. Embodiment steps of the present invention may be performed by hardware components or may be embodied in machine-executable instructions, which may be used to cause a general-purpose or special-purpose processor programmed with the instructions to perform the steps. Alternatively, the steps may be performed by a combination of hardware and software.

Embodiments of the present invention may be provided as a computer program product, or software, that may include a machine-accessible medium having stored thereon instructions, which may be used to program a computer system (or other electronic devices) to perform a process according to embodiments of the present invention. A machine accessible medium includes any mechanism for storing or transmitting information in a form (e.g., software, processing application) accessible by a machine (e.g., a computer). The machine-accessible medium may includes, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; electrical, optical, acoustical or other form of propagated signal (e.g., carrier waves, infrared signals, digital signals, etc.); or other type of medium suitable for storing electronic instructions.

Some portions of the description that follow are presented in terms of algorithms and symbolic representations of operations on data bits that may be stored within a memory and operated on by a processor. These algorithmic descriptions and representations are the means used by those skilled in the art to effectively convey their work. An algorithm is generally conceived to be a self-consistent sequence of acts leading to a desired result. The acts are those requiring manipulation of quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, parameters, or the like.

Methods and apparatus are described that use cell voltage and/or current as monitor to prevent electrochemical deposition (e.g., electroplating) tools from deplating wafers with no or poor metal (e.g., Cu) seed coverage. The methods and apparatus described may be used for the calibration and monitoring of the electrochemical deposition system. In on embodiment, calibration may include determining a reference resistance of a reference wafer, determining a calibration resistance of a calibration wafer, comparing the reference resistance with the calibration resistance, and selecting an error trigger value based on the comparing of reference resistance with the calibration resistance. It should be noted that the reference and calibration resistances are not the resistance of the thin copper seed layer of the reference wafer and calibration wafer, respectively. Rather, the reference resistance and the calibration resistance are the resistances of the electrochemical deposition (e.g., electroplating) cell with the reference wafer and the calibration wafer, respectively, which is equal to the cell voltage divided by the total current.

After the calibration is performed, the cell voltage response of wafers processed by the electrochemical deposition system may be monitored using the predetermined error trigger value. In one embodiment, computer software may be used to implement the calibration of the electrochemical deposition system and/or monitoring of wafers under the electrochemical deposition in order to determine if the wafers are receiving sufficient edge coverage according to the prior determined error trigger value.

Embodiments of the present invention may be discussed herein in relation to Cu metal layers and electroplating operations only for ease discussion. In alternative embodiments, the methods and apparatus discussed herein may be used in connection with other electrochemical deposition operations and other metals. In addition, the methods and apparatus described herein are generally applicable to the detection of differences between conducting and non-conducting surfaces. This is due to the factor that there exists a substantial cell voltage difference when passing the same plating current through the different surfaces.

Figure 2:
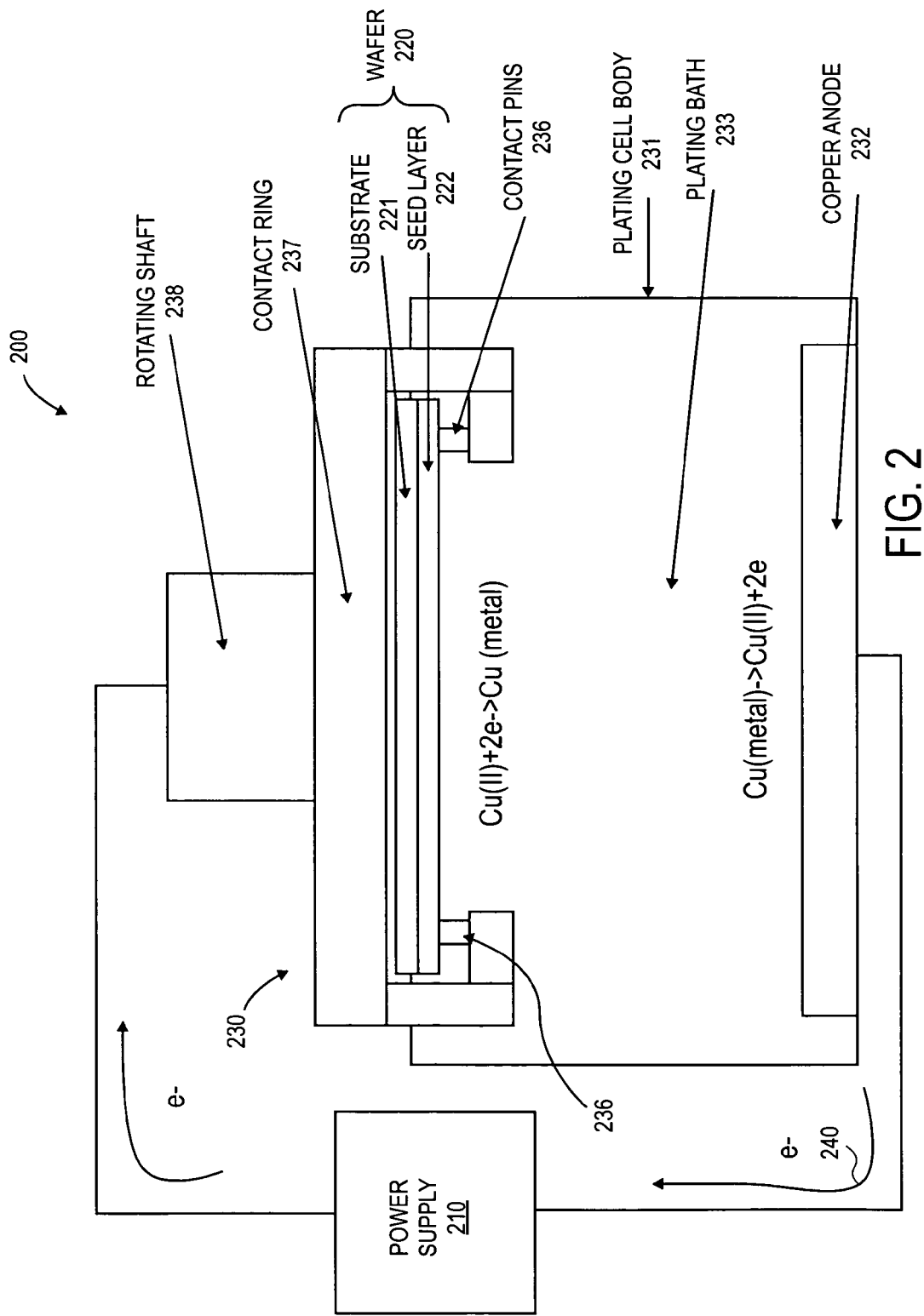
FIG. 2 illustrates one embodiment of an electroplating system.

FIG. 2 illustrates one embodiment of an electroplater. Electroplater 200 includes a power source 210 coupled to a plating cell 230 to plate a wafer 220. Wafer 220 includes a substrate 221 and a seed layer 222. Seed layer 222 may be disposed on substrate 221 using various techniques known in the art, for example, physical vapor deposition (PVD) and non-electrochemical techniques. In one embodiment, a barrier layer (not shown) maybe disposed between the substrate 221 and seed layer 222.

Plating cell 230 includes a plating cell body 231, an anode (e.g., copper) 232, plating bath 233 and a contact ring body 237 to dispose wafer 220 in plating bath 233. When plating electrode areas on wafer 220, an electrode (cathode) contact is made to the wafer 220. In the plating process, wafer 220 is placed on a contact ring 237. The contact ring 237 has multiple protruding contact pins 236 (e.g., two of the contacts pins illustrated in the cross section of FIG. 2) that provide electrical contact with wafer 220. The contact ring 237 is covered by a non-conductive material (e.g., polymer) except for the contact pins 236. The contact pins 236 make contact with wafer 220 at the outer edge of the wafer 220. In one embodiment, a rotating shaft 238 may be used to rotate contact ring 237 and, thereby, wafer 220 in plating bath 233. The wafer 220 is placed onto the contact ring 237 facing down in the plating bath 233. A thrust plate may be disposed at the bottom of shaft 238 to press on the backside substrate of wafer 220 during the plating operation. The pressure from the thrust plate presses wafer 220 to make uniform contact with the contact pins 236 in order to provide better uniformity of the deposited Cu film. An o-ring may be disposed on the thrust plate to prevent the electrolyte from making contact with the backside of wafer 220 to minimize contamination of Cu to the backside of wafer 220 from the electrolyte.

Because the area of contact between pins 236 and wafer 220 is so small compared to entire surface area of wafer 220, the contact pins 236 can only sustain a limited portion of the current driven by external power supply 210. Due to mass transport control of Cu deposition, a second electrochemical reaction has to be activated to support the rest of the current flow 240. In an aqueous Cu sulfate solution, the second reaction will be a reduction of either proton or water depending on the pH of the electrolyte. Since there is (1) a significant potential difference between the Cu deposition and hydrolysis of water, and (2) a significant ohmic drop through a plating cell due to current distribution differences, there will be a significant difference in cell voltage response when plating a wafer 220 with or without Cu seed layer 222 coverage at the electrical contact areas on the wafer edge with the contact pins 236. This can be used to distinguish whether the electroplater 200 is processing a wafer 220 with or without Cu seed layer 222 coverage or poor Cu seed layer 222 coverage on the edge of wafer 220 and, thereby, protect electroplater 200 from a potentially disastrous deplating incident.

The electroplater 200 may first be calibrated using the difference in cell voltage response characteristic between a wafer considered to have substantially complete Cu seed coverage at its edge (referred to as a "reference wafer") and a wafer consider to have no, or insufficient, seed coverage at its edge (referred to as a "calibration wafer"). The electroplater 200 is calibrated to determine a practical error trigger value at which electroplater 200 is considered to be operating improperly. The electroplater 200 may then be operated and monitored using the pre-determined error triggering value in order to determine when the electroplater 200 is not providing proper seed layer coverage at the edge of a wafer. For example, this may lead to Cu metal deposition occurring very near the electrical contact pins 236 of electroplater 200. As the deposits accumulate on the electrical contact pins 239, pieces of the electroplating debris may fall into plating bath 233 that can eventually cause serious plating defects on wafers that are subsequently processed. As such, upon the occurrence of the predetermined error trigger, electroplater 200 may be aborted and the system error corrected before a catastrophic failure is reached that might otherwise require removal of the entire plating bath 233 solution and the cleaning of all related electroplater 200 equipment.

Figure 3:
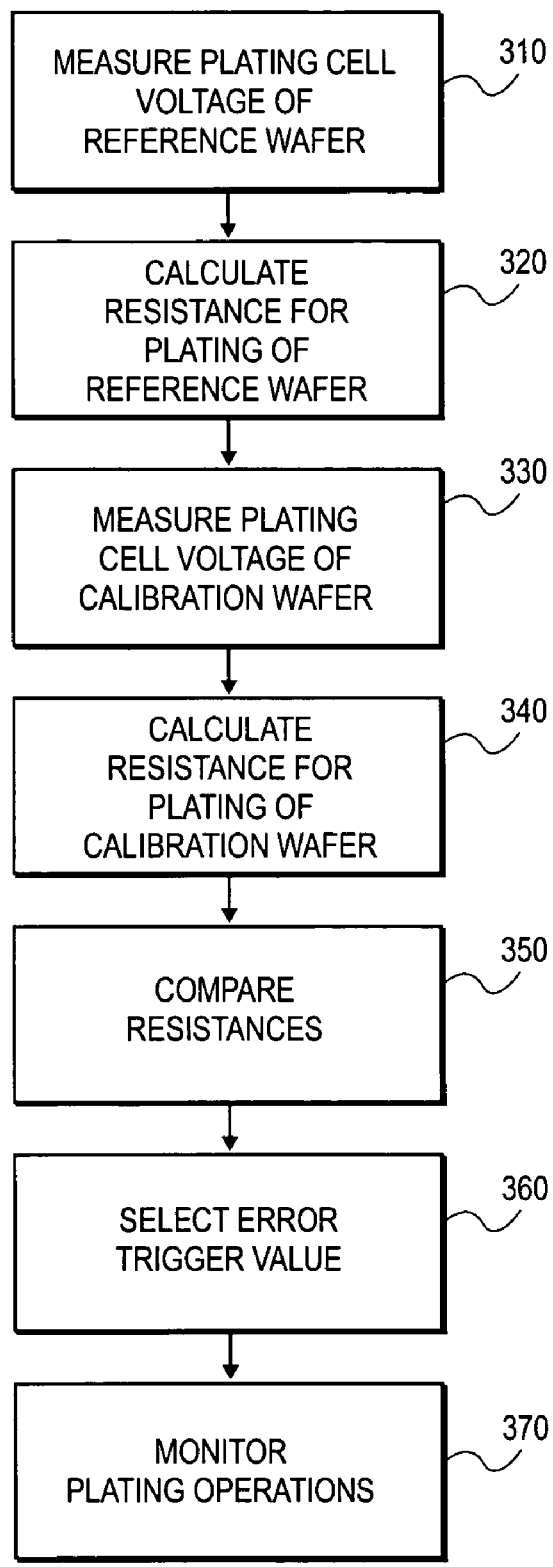
FIG. 3 illustrates one embodiment of a method of calibrating a plating operation.

FIG. 3 illustrates one embodiment of a method of calibrating a plating operation. In this embodiment, at block 310, the plating cell voltage of a plating cell is measure when plating a normal wafer with substantially complete or sufficient seed (e.g., Cu) coverage (hereinafter "reference wafer") at the edge of the wafer at various (e.g., one or more) plating currents. The cell voltage response is measured during the plating operation when the electrical plating currents are on.

Next, at block 320, the resistance (cell voltage response/plating currents) is calculated for the plating of the reference wafer. The resistance calculated at block 320 may be referred to as a "reference resistance." At block 330, the cell voltage of a plating cell is measured when plating a wafer without or insufficient seed coverage edge (hereinafter "calibration wafer") at the wafer's edge at one or more of the various plating currents. At block 340, the resistance (cell voltage response/plating currents) is calculated for the plating of the calibration wafer. The resistance calculated at block 340 may be referred to as a "calibration resistance." Then, at block 350, the reference resistance of block 320 is compared with the calibration resistance from block 340. At block 360, a practical error triggering value is selected to determine when the plating system aborts based on the comparison at block 350. In one exemplary embodiment discussed below, the practical error trigger value may be selected to be approximately a 25% or change in measured cell voltage over that of measured cell voltage in a reference wafer. Alternatively, the error trigger value may be selected to be less than or greater than approximately a 25% change in the cell voltage. In another embodiment, the error trigger value may be selected to anywhere in the approximate range of 1% to 50%.

After the calibration is performed, the cell voltage response of production wafers processed by electroplater 200 may be monitored, block 370, using the predetermined error trigger value. The term "production" refers to any wafers other than the reference wafer and the calibration wafer, including prototype wafers, experimental wafers, etc. In one embodiment, computer software may be used to implement the blocks shown in FIG. 3 to calibrate electroplater 200 and/or monitor whether wafers under electroplating are receiving edge coverage according to the prior determined error trigger value. The software may be configured to abort, or shutdown, electroplater 200 when the predetermined error triggering value is reached. Alternatively, part or all of the calibration and monitoring may be performed by an operator.

FIG. 4 is a table illustrating experimental cell voltage measurements for a reference wafer and a calibration wafer for various plating currents. Table 400 includes a plating current column 410, a reference wafer cell voltage column 420, a calibration wafer cell voltage column, 430, a cell voltage difference column 440, and a percentage (%) difference column 450. Plating current column 410 contains the eight plating currents that were used in the experiment ranging from 0.1 amps to 15 amps. Column 420 contains the cell voltage measurements on a reference wafer at the corresponding plating currents. Column 430 contains the cell voltage measurements on a calibration wafer at the corresponding plating currents. Column 440 contains the difference between the reference wafer and calibration wafer cell voltages at the corresponding plating currents. Column 450 contains the ratio between the cell voltage difference of column 440 and the cell voltages of the reference wafer at the corresponding plating currents. As can be seen from column 450, in one experiment, the percentage difference was empirically determined to be 52.7382%. The data in table 400 is calculated from a linear regression and, therefore, the ratios in column 450 are the same for the various plating currents of column 410. Original measurements are presented as the square and diamond points in chart 500 of FIG. 5. In one embodiment, the error trigger value may be selected to be approximately half the 52.7382% ratio, or approximately a 25% change in the cell voltage.

Figure 5:
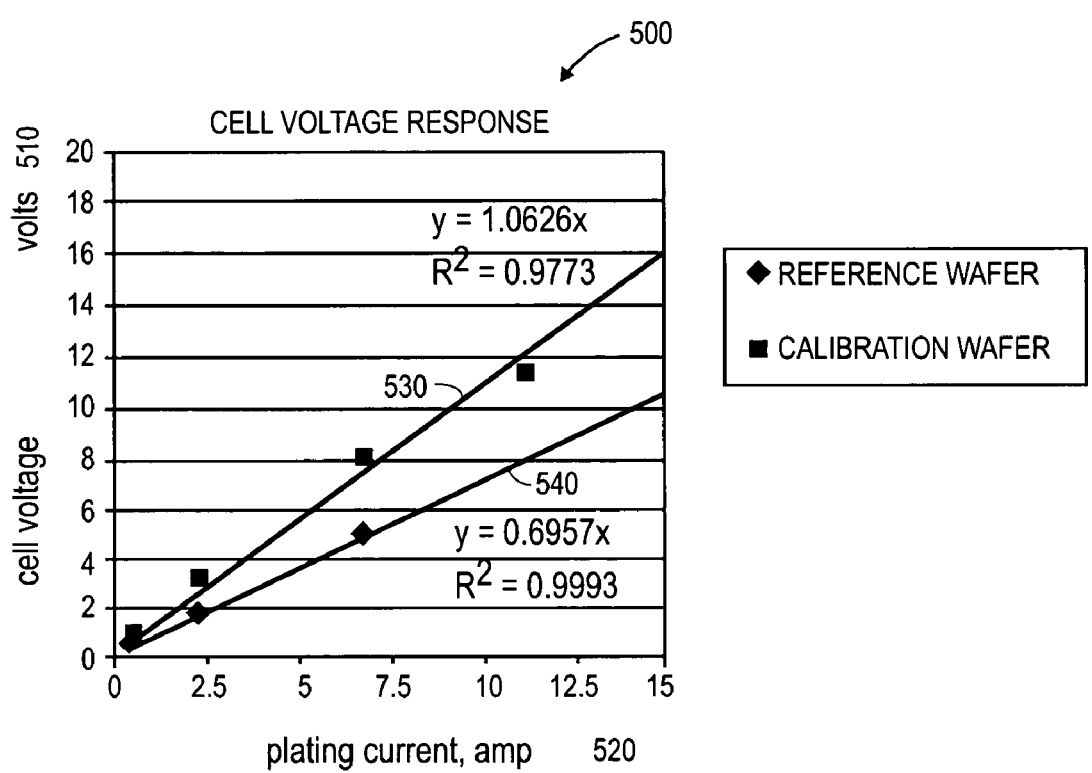
FIG. 5 is a chart illustrating the cell voltage responses of a reference wafer and a calibration wafer using the empirical data from the table of FIG. 4.

FIG. 5 is a chart illustrating the cell voltage responses of a reference wafer and a calibration wafer using the exemplary empirical data from table 400 of FIG. 4. The y-axis 510 of chart 500 provides cell voltage in volts. The x-axis 520 of chart 500 provides the plating current in amps. Line 530 shows the linear interpolation of the cell voltage response for the calibration wafer. Line 540 shows the linear interpolation of the cell voltage response for the reference wafer. Line 530 has a slope ($R^2$) equal to 0.9773 and line 540 has a slope ($R^2$) equal to 0.9993.

Figure 6:
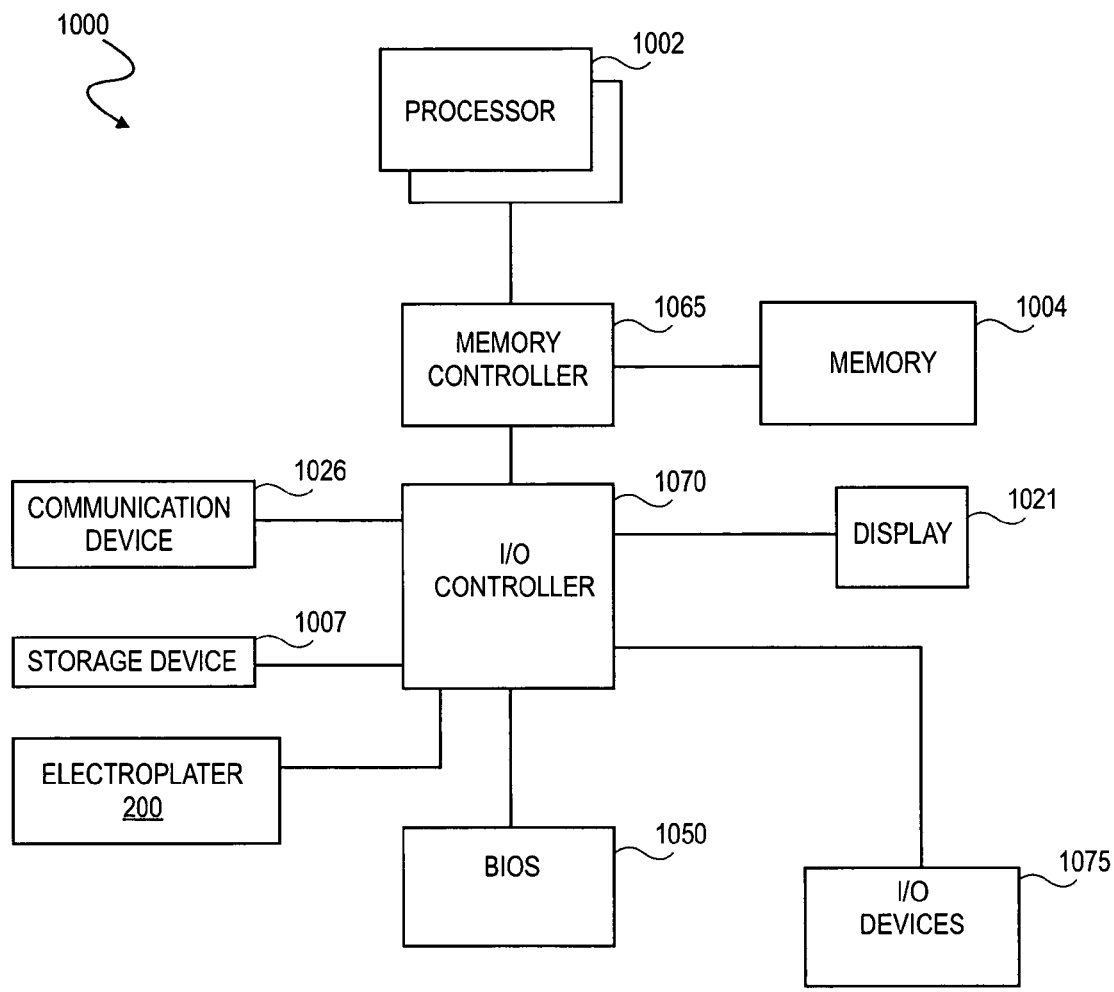
FIG. 6 illustrates one embodiment of an electroplating system.

FIG. 6 illustrates an exemplary embodiment of an electroplating system. In this embodiment, digital processing components may be connected to electroplater 200 to perform the calibration and/or monitoring operations discussed above. In one embodiment, electroplating system 1000 includes one or more buses or other means for transferring data among components of electroplating system 1000. Electroplating system 1000 also includes processing means such as processor 1002 coupled with a system bus for processing information. Processor 1002 may represent one or more general purpose processors (e.g., a Motorola PowerPC processor and an Intel Pentium processor) or special purpose processor such as a digital signal processor (DSP) (e.g., a Texas Instrument DSP). Processor 1002 may be configured to execute the instructions for performing the operations and blocks discussed herein. For example, processor 1002 may be configured to calculate and compare the reference resistance and the calibration resistance discussed above in relation to FIG. 3.

Electroplating system 1000 further includes system memory 1004 that may include a random access memory (RAM), or other dynamic storage device, coupled to memory controller 1065 for storing information and instructions (e.g., calibration and/or monitoring operations) to be executed by processor 1002. Memory controller 1065 controls operations between processor 1002 and memory devices such as memory 1004. Memory 1004 also may be used for storing temporary variables or other intermediate information during execution of instructions by processor 1002. Memory 1004 represents one or more memory devices, for example, memory 1004 may also include a read only memory (ROM) and/or other static storage device for storing static information and instructions for processor 1002.

Electroplating system 1000 may also include an I/O controller 1070 to control operations between processor 1002 and one or more input/output (I/O) devices 1075, for examples, a keyboard and a mouse. I/O controller 1070 may also control operations between processor 1002 and peripheral devices, for example, a storage device 1007. Storage device 1007 represents one or more storage devices (e.g., a magnetic disk drive or optical disc drive) coupled to I/O controller 1070 for storing information and instructions. Storage device 1007 may be used to store instructions for performing the blocks discussed herein. I/O controller 1070 may also be coupled to BIOS 1050 to boot electroplating system 1000.

It should be noted that the architecture illustrated in FIG. 6 is only exemplary. In alternative embodiments, other architectures may be used for electroplating system 1000. For examples, memory controller 1065 and the I/O controller 1070 may be integrated into a single component and/or the various components may be coupled together in other configurations (e.g., directly to one another) and with other types of buses.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
    determining a reference resistance of an electrochemical deposition cell including a reference wafer;
    determining a calibration resistance of an electrochemical deposition cell including a calibration wafer;
    comparing the reference resistance with the calibration resistance; and
    selecting an error trigger value based on the comparing of reference resistance with the calibration resistance.

2. The method of claim 1, wherein determining a reference resistance comprises:
    measuring a first electrochemical deposition cell voltage with the reference wafer; and
    calculating the reference resistance using the first electrochemical deposition cell voltage with the reference wafer.

3. The method of claim 2, further comprising measuring a first plurality of electrochemical deposition cell voltages with the reference wafer at a corresponding first plurality of electrochemical deposition currents.

4. The method of claim 2, wherein determining a calibration resistance comprises:
    measuring a second electrochemical deposition cell voltage with the calibration wafer; and
    calculating the calibration resistance using the second electrochemical deposition cell voltage with the calibration wafer.

5. The method of claim 2, further comprising measuring a second plurality of electrochemical deposition cell voltages with the calibration wafer at a corresponding second plurality of electrochemical deposition currents.

6. The method of claim 1, further comprising monitoring a electrochemical deposition of one or more production wafers using the selecting error trigger value.

7. The method of claim 6, wherein monitoring further comprises:
    measuring the electrochemical deposition cell voltages with the one or more production wafers; and
    determining when one of the electrochemical deposition cell voltages with the one or more production wafers is approximately equal to or greater than the edge trigger value.

8. The method of claim 7, further comprising aborting the electrochemical deposition of the one or more production wafers when the one of the electrochemical deposition cell voltages with the one or more production wafers is determined to be approximately equal or greater than the edge trigger value.

9. The method of claim 7, wherein the error trigger value is selected to be approximately a 25% difference from a measured first electrochemical deposition cell voltage with the reference wafer.

10. The method of claim 1, wherein the reference wafer has a conducting layer disposed over a non-conducting layer, the non-conducting layer is substantially covered with the conducting layer at an edge of the reference wafer, and wherein the calibration wafer has a conducting layer disposed over a non-conducting layer, the non-conducting layer of the calibration wafer is substantially uncovered by the conducting layer of the calibration wafer at an edge of the calibration wafer.

11. The method of claim 10, wherein the conducting layers of the calibration and reference wafers are seed layers.

* * * * *